(12) United States Patent
Matsuda (10) Patent No.: US 6,515,236 B2
(45) Date of Patent: Feb. 4, 2003

(54) PRINTED WIRING BOARD AND MANUFACTURING METHOD OF THE PRINTED WIRING BOARD

(75) Inventor: Yoshinari Matsuda, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/950,136

(22) Filed: Sep. 10, 2001

(65) Prior Publication Data

US 2002/0053469 A1 May 9, 2002

(30) Foreign Application Priority Data

Sep. 12, 2000 (JP) .................................. 2000-281769

(51) Int. Cl.[7] .................................................. H01R 9/09
(52) U.S. Cl. ...................... 174/261; 174/255; 333/246; 361/777
(58) Field of Search ................................ 174/261, 255, 174/256; 361/792, 777; 257/664; 333/246

(56) References Cited

U.S. PATENT DOCUMENTS

| | | | | |
|---|---|---|---|---|
| 5,311,406 A | * | 5/1994 | Snodgrass et al. | 361/792 |
| 5,748,006 A | * | 5/1998 | Sano | 333/246 |
| 5,764,119 A | * | 6/1998 | Miagi et al. | 174/250 |
| 6,120,906 A | * | 9/2000 | Terashi | 428/426 |

* cited by examiner

Primary Examiner—Albert W. Paladini
(74) Attorney, Agent, or Firm—Jay H. Maioli (57) ABSTRACT

A printed wiring board in which control of a characteristic impedance of a signal transmission pattern is realized. The printed wiring board includes a flat plate base material, a signal transmission pattern provided on at least one surface of the base material for transmitting a high frequency signal, an insulator layer formed with a constant thickness to cover the signal transmission pattern, and a grounded control unit provided on the insulator layer opposing the signal transmission pattern for controlling a characteristic impedance of the signal transmission pattern.

16 Claims, 7 Drawing Sheets

200~# PRINTED WIRING BOARD AND MANUFACTURING METHOD OF THE PRINTED WIRING BOARD

BACKGROUND OF THE INVENTION

1. Field of the Invention

The present invention relates to a printed wiring board provided with a signal transmission pattern for transmitting a high frequency signal in which characteristic impedance becomes a problem, and a manufacturing method of the printed wiring board.

2. Description of the Related Art

In a dielectric substrate requiring high frequency and high speed digital transmission, a characteristic impedance is generally required for a transmission line (pattern). This characteristic impedance is an electric circuit constant expressing characteristics of the transmission line wired on the substrate for handling a high frequency current. The value of the characteristic impedance is set so that the transmission line is electromagnetically coupled to a solid power supply layer and a solid ground layer to form an equivalent distributed constant transmission line. In regard to the above request, a multilayer substrate is adopted, and etching widths of an image plane connected to a solid layer and an insulating layer of a transmission line are made to have desired values with precision, so that a printed wiring board (hereinafter referred to as "an impedance control board") capable of controlling the characteristic impedance is realized.

Figure 8A:
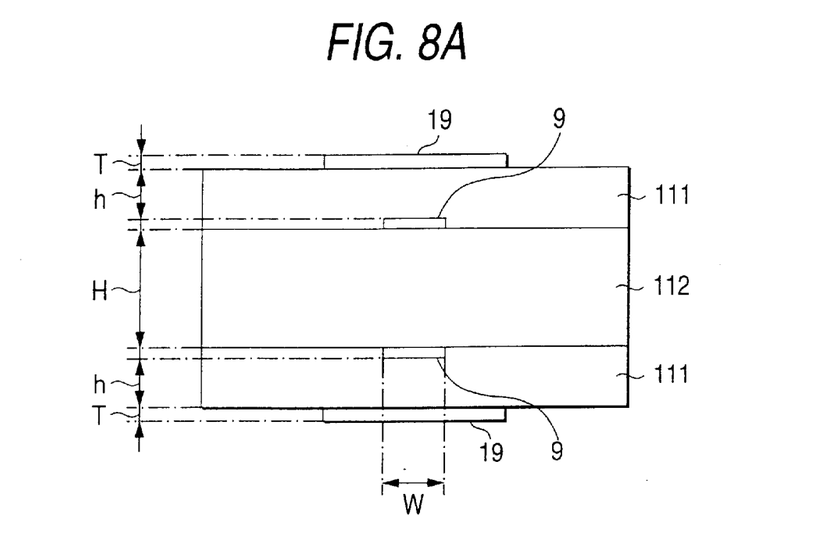
FIGS. 8A to 8C are sectional views showing a structural example of a conventional impedance control board.
Figure 8B:
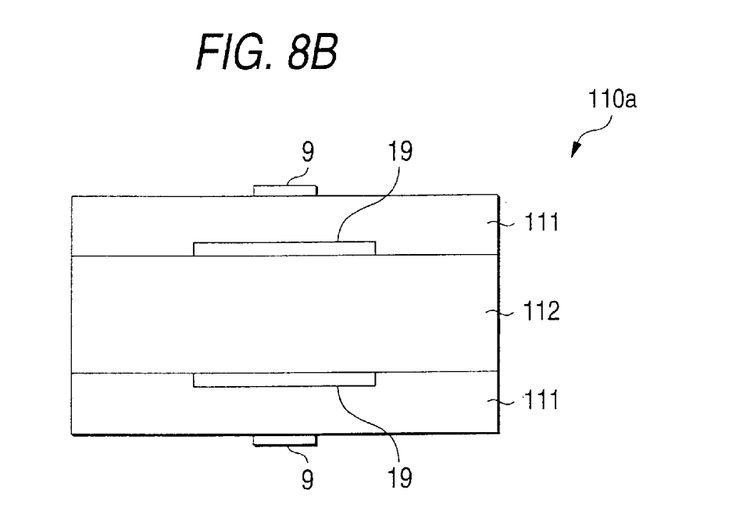
Figure 8C:
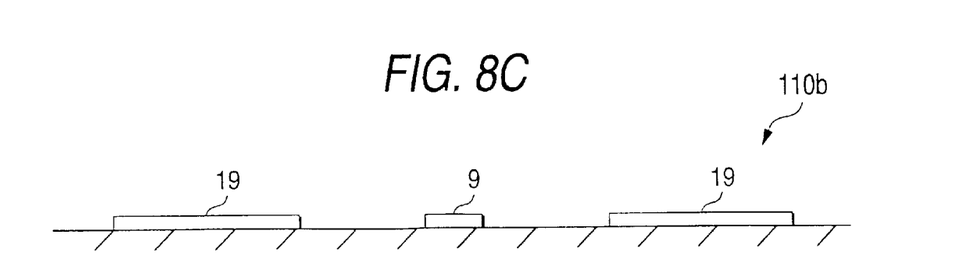

FIGS. 8A to 8C are sectional views showing structural examples of conventional impedance control boards 110, 110a and 110b, respectively.

Values of these characteristic impedances are values which can be calculated by an approximate expression with parameters of a thickness H between prepregs 111, a width W of a transmission line 9, a thickness T of a solid ground layer 19, and a relative dielectric constant $\in$. The precision of the characteristic impedance is determined by the precision of these parameters.

The impedance control boards 110 and 110a of multilayer substrates shown in FIGS. 8A and 8B are multilayer substrates of microstrip line structure and stripline structure, respectively.

On the other hand, the impedance control board 110b shown in FIG. 8C adopts a coplanar structure which is not a multilayer substrate, and has such a structure that a transmission line 9 having characteristic impedance to be controlled is sandwiched between solid ground layers 19 (hereinafter referred to as "ground lines"). The impedance control board 110b can be realized by substantially the same constitution in either case where the transmission line 9 is formed on both sides or on one side.

However, since the impedance control board 110 and 110a shown in FIGS. 8A and 8B are respectively multilayer substrates, specific finishing precision and its management step are required, and there has been a problem that costs become very high. Besides, it is necessary that the multilayer substrate is generally manufactured by an expensive batch type large press and by taking labor, and there has been a problem that production efficiency is poor. Besides, when it is desired to control a characteristic impedance of only a part of the substrate, the multilayer plate must be used, and the cost has not been reasonable.

On the other hand, in the impedance control board 110b shown in FIG. 8C, in the case where a number of transmission lines 9 are wired to be parallel to each other like, for example, bus lines, the sandwiching ground lines 19 are required for each of the transmission lines 9, and there has been a problem that a nearly double wiring space is required and wiring design is hard to make.

SUMMARY OF THE INVENTION

Then, the present invention has an object to solve the above problems and to provide a printed wiring board in which control of a characteristic impedance of a signal transmission pattern is realized with a small space and at a low cost, and high manufacturing efficiency, a delay is hard to cause, and a high frequency signal can be stably transmitted.

According to a first aspect of the invention, the above object can be achieved by a printed wiring board characterized by comprising at least one signal transmission pattern with a predetermined width and thickness provided on a surface of a base material, for transmitting a high frequency signal; an insulator layer formed to a constant thickness on said surface of said signal transmission pattern for insulating said signal transmission pattern; a connection pattern, formed out side of said insulator layer and on said surface of said base material, and connected to a reference voltage; and a opposing pattern provided on a surface of said insulator layer so as to oppose said signal transmission pattern and to be connected to said connection pattern.

According to the constitution of the first aspect, the signal transmission pattern is provided on at least one surface of the flat plate base material, and has a function of transmitting a high frequency signal. This signal transmission pattern is covered with the insulator layer formed to the constant thickness. A connection pattern is formed out side of said insulator layer and on said surface of said base material, and connected to a reference voltage. On the other hand, an opposing pattern is provided on the insulator layer so as to be opposite to the signal transmission pattern. This opposing pattern has a function of controlling the characteristic impedance of the signal transmission pattern. Thus, the characteristic impedance is controlled and the high frequency signal of the signal transmission pattern is stably transmitted without causing a delay. Besides, when the opposing pattern is connected to a reference voltage via the connection pattern, unnecessary radiation noise radiated from other surrounding signal transmission patterns or the like can also be cut off.

The invention of a second aspect is characterized in that in the constitution of the first aspect, the opposing pattern is formed of a conductive paste.

According to the constitution of the second aspect, in addition to the operation of the first aspect, the opposing pattern can be easily formed on the insulator layer even if a multilayer substrate is not used.

The invention of a third aspect is characterized in that in the constitution of the first aspect, a width of the opposing pattern is three or more times as large as a width of said signal transmission pattern.

According to the constitution of the third aspect, in addition to the operation of the first aspect, when the width of the opposing pattern is on this level, it becomes sufficiently wide relative to the width of the signal transmission pattern. Accordingly, the opposing pattern can suitably control the characteristic impedance of the signal transmission pattern.

The invention of a fourth aspect is characterized in that in the constitution of the first aspect, the insulator layer is formed of a dry film of an epoxy resin having photosensitivity.

The invention of a fifth aspect is characterized in that in the constitution of the first aspect, the insulator layer is formed by curtain coat coating of a liquid epoxy resin having photosensitivity.

The invention of a sixth aspect is characterized in that in the constitution of the first aspect, the insulator layer is formed by printing using a photo-curing resist.

The invention of a seventh aspect is characterized in that in the constitution of the first aspect, the insulator layer is formed by printing using a thermosetting resist.

According to the respective constitutions of the fourth to seventh aspects, in addition to the operation of the first aspect, the insulator layer can be easily formed so as to cover the signal transmission pattern.

The invention of an eighth aspect is characterized in that in the constitution of the first aspect, the opposing pattern is connected to a ground layer provided on the other surface of the base material through a via hole for conducting electricity to pass through both the plane surfaces of the base material.

The invention of a ninth aspect is characterized in that in the constitution of the first aspect, the opposing pattern covers a part of the signal transmission pattern formed on the surface of the base material.

According to the invention of a ninth aspect, the above object is achieved by a manufacturing method of a printed wiring board, characterized by comprising at least one signal transmission pattern with a predetermined width and thickness provided on a surface of a base material, for transmitting a high frequency signal; an insulator layer formed to a constant thickness on said surface of said signal transmission pattern for insulating said signal transmission pattern; a connection pattern, formed out side of said insulator layer and on said surface of said base material, and connected to a reference voltage; and a opposing pattern provided on a surface of said insulator layer so as to oppose said signal transmission pattern and to be connected to said connection pattern.

According to the constitution of the ninth aspect, the signal transmission pattern and the connection pattern are provided on a surface of the flat plate base material, and has a function of transmitting a high frequency signal. This signal transmission pattern is covered with the insulator layer formed to the constant thickness on the other hand, the opposing pattern is grounded via the connection pattern and is provided on the insulator layer so as to be opposite to the signal transmission pattern. This opposing pattern has a function of controlling the characteristic impedance of the signal transmission pattern. Thus, the characteristic impedance is controlled by the opposing pattern and the high frequency signal of the signal transmission pattern is stably transmitted without causing a delay. Besides, when the opposing pattern is connected to the reference voltage, unnecessary radiation noise radiated from other surrounding signal transmission patterns or the like can also be cut off. According to the manufacturing method of the printed wiring board like this, the printed wiring board can be manufactured by fewer steps than multi layer substrate board.

The invention of a tenth aspect is characterized in that in the constitution of the ninth aspect, a width of the opposing pattern is three or more times as large as a width of the signal transmission pattern.

According to the constitution of the tenth aspect, in addition to the operation of the ninth aspect, when the width of the opposing pattern is on this level, it becomes sufficiently wide relative to the width of the signal transmission pattern. Accordingly, the opposing pattern can suitably control the characteristic impedance of the signal transmission pattern.

The invention of a eleventh aspect is characterized in that in the constitution of the ninth aspect, the opposing pattern is formed of a conductive paste.

According to the constitution of the eleventh aspect, in addition to the operation of the ninth aspect, the opposing pattern can be easily formed on the insulator layer.

The invention of a twelfth aspect is characterized in that in the constitution of the ninth aspect, the insulator layer is formed of a dry film of an epoxy resin having photosensitivity.

The invention of a thirteenth aspect is characterized in that in the constitution of the ninth aspect, the insulator layer is formed by curtain coat coating of a liquid epoxy resin having photosensitivity.

The invention of a fourteenth aspect is characterized in that in the constitution of the ninth aspect, the insulator layer is formed by printing using a photo-curing resist.

The invention of a fifteenth aspect is characterized in that in the constitution of the ninth aspect, the insulator layer is formed by printing using a thermosetting resist.

According to the respective constitutions of the twelfth to fifteenth aspects, in addition to the operation of the ninth aspect, the insulator layer can be easily formed so as to cover the signal transmission pattern.

The invention of a sixteenth aspect is characterized in that in the constitution of the ninth aspect, the opposing pattern is connected to a solid pattern provided on the other surface of the base material through a via hole for conducting electricity to pass through both the plane surfaces of the base material.

DETAILED DESCRIPTION OF THE PREFERRED EMBODIMENTS

Hereinafter, preferred embodiments of the present invention will be described in detail with reference to the accompanying drawings.

Incidentally, since the embodiments described below are preferred specific examples of the present invention, technically desirable various limitations are put, however, the scope of the present invention is not limited to these embodiments unless there is a statement to specifically limit the present invention in the following description.

First Embodiment

Figure 1:
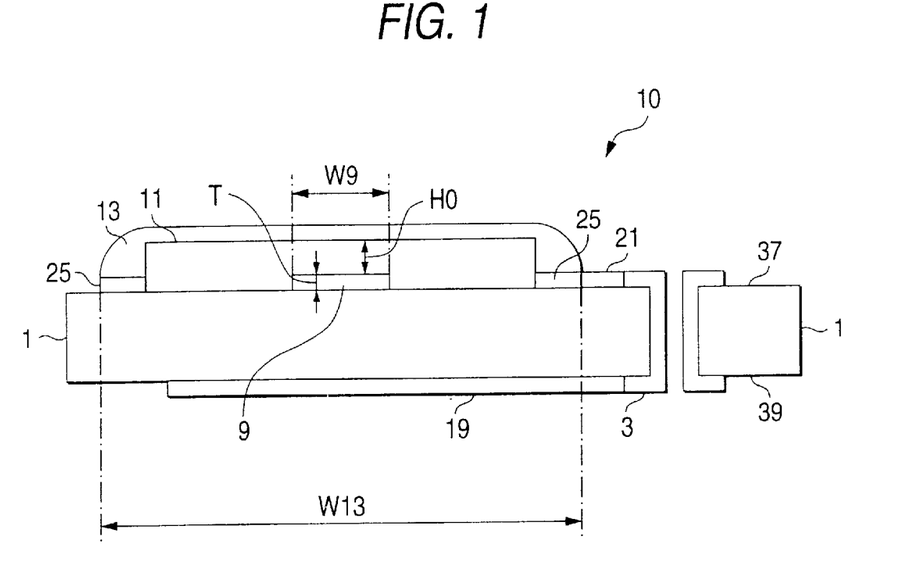
FIG. 1 is a sectional view showing a structural example of an impedance control board as a first embodiment of the present invention.

FIG. 1 is a sectional view showing a structural example of an impedance control board 10 as a first embodiment of the present invention.

The impedance control board 10 includes a base material 1, a via hole 3, a solid layer 19, a connection line 21, a transmission line 9 (signal transmission pattern), an insulator layer 11, a junction land 25, and an image plane 13 (opposing pattern).

The impedance control board 10 is a board used for, for example, a tuner portion of a television receiver, a printed wiring board of a high speed digital block, or the like. This impedance control board 10 is such a board that a high frequency signal of the transmission line 9 is stably transmitted without a delay while characteristic impedance having an influence on the transmission line 9 for transmitting the high frequency signal is controlled by the image plane 13. This transmission line 9 is, for example, a copper foil made of copper, and at least one line, normally, a number of lines are formed on the base material 1.

The base material 1 is a flat plate material and has one surface 37 and the other surface 39. In the case where the transmission line 9 is formed on both surfaces of the one surface 37 and the other surface 39, a material having an insulation property such as glass or epoxy is suitable for the base material 1. In the case where the transmission line 9 is formed on either one side of the one surface 37 and the other surface 39, a material having an insulation property such as paper phenol is suitable for the base material 1.

Besides, in the base material 1, the via hole 3 is provided in a hole passing through the one surface 37 and the other surface 39. This via hole 3 has a function of transmitting electric signals including the high frequency signal from the one surface 37 to the other surface 39.

The transmission line 9, the junction land 25, the connection line 21, the insulator layer 11, the image plane 13 and a part of the via hole 3 are provided on the one surface 37. The transmission line 9 is covered with the insulator layer 11 on the one surface 37 of the base material 1. This insulator layer 11 is formed to a constant thickness with precision, and a distance H0 between the transmission line 9 and the image plane 13 is made a constant value.

This insulator layer 11 is a material having an insulation property. The insulator layer 11 is covered with the image plane 13, and the junction land 25 is provided on the one surface 37 of the base material 1 at at least one edge of the image plane 13. This junction land 25 is connected to the via hole 3 through the signal line 21.

The image plane 13 is for controlling the characteristic impedance with respect to the high frequency signal of the transmission line 9. In the base material 1 on which the transmission line 9 is formed, this image plane 13 is formed in a part or all portions in which the characteristic impedance must be controlled, so as to cover the transmission line 9 as the need arises. If the image plane 13 is made to cover a part of the transmission line 9 formed on the surface of the base material 1, the image plane 13 can control the characteristic impedance of not all the transmission line 9, but only the part. This image plane 13 is formed of a conductive paste, and a material having a low ground impedance is desirable. Besides, as the image plane 13, for example, a copper paste or a silver paste is desirable.

On the other hand, the solid layer 19 and a part of the via hole 3 are provided on the other surface 39. The solid layer 19 and the via hole 3 are electrically connected to each other. This solid layer 19 is a wide member on a plane along the other surface 39, and may be grounded or may be connected to a power supply. Like this, when the solid layer 19 is grounded or connected to the power supply, the image plane 13 connected to the solid layer 19 through the via hole 3 can prevent the delay of the high frequency signal by controlling the characteristic impedance of the transmission line 9. Thus, the transmission line 9 can stably transmit the high frequency signal. Here, the "image plane" indicates ground connection or connection to a power supply. Besides, the image plane 13 to which the grounded solid layer 19 is connected can also cut off unnecessary radiation noise radiated from other surrounding transmission lines or circuits.

It is desirable that a width W13 of the image plane 13 is three or more times as large as a width W9 of the transmission line 9 in a case where the centers of the image plane 13 and the transmission line 9 are made coincident with each other. Besides, it is desirable that the area of this image plane 13 is three or more times as large as the area of the transmission line 9. By doing so, capacitance Co formed of the image plane 13 and the transmission line 9 and shown in FIG. 2 has a suitable value, and a required characteristic impedance value $Zo=(Lo/Co)^{1/2}$ can be stably supplied.

By such constitution, the impedance control board 10 can have a stripline structure. Next, an example of a manufacturing method of the impedance control board 10 will be described.

FIGS. 3A to 3E are sectional views for respectively showing an example of a manufacturing process of the impedance control board 10.

Although the following description is given of the example of the manufacturing method of the impedance control board 10 in the case where the image plane 13 is grounded, since a manufacturing method of the impedance control board 10 in the case where the image plane 13 is connected to a power supply is also the same, its description is omitted.

Figure 3A:
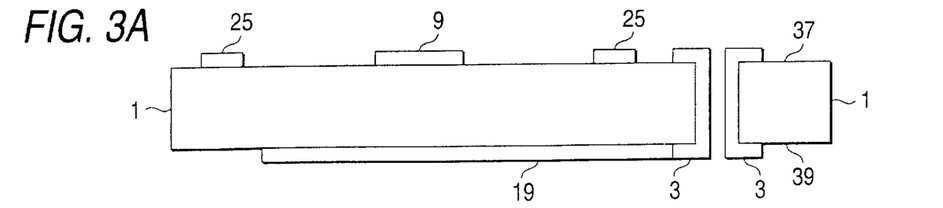
FIGS. 3A to 3E are sectional views showing an example of a manufacturing process of an impedance control board.

Transmission line formation step:

First, as shown in FIG. 3A, in a transmission line formation step, a transmission line 9 for transmitting a high frequency signal, and so on are formed on at least one surface 37 of a flat plate base material 1. In addition, in a first manufacturing method, a junction land 25, a solid layer 19, and a via hole 3 are formed on or in the base material 1.

Insulator layer formation step:

In an insulator layer formation step, an insulator layer 11 with a constant thickness is formed on the surface 37 of the base material 1 so as to cover the transmission line 9. This insulator layer 11 is formed by, for example, a dry film laminate method. The material of this dry film is, for example, an epoxy resin having photosensitivity, and the dry film having thickness precision in advance is thermocompression bonded onto the surface 37 of the base material 1 including the transmission line 9. Then, the insulator layer 11 made of this dry film is formed on this surface 37. As specific conditions, a heat roll 5 shown in FIG. 3B makes roll laminate while moving in an X direction at, for example, 1 to 2 m/minute, and pressurization is made by a normal pressure laminator at about 100 to 150° C.

Figure 3B:
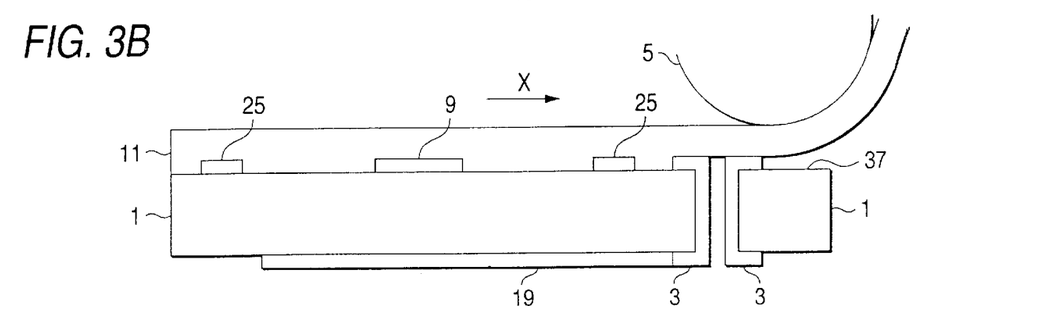
Figure 3C:
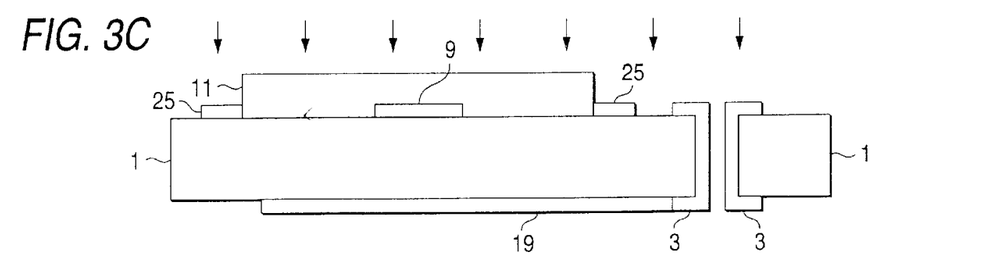

Next, in the insulator layer formation step, and in the insulator layer 11 made of the dry film formed as shown in FIG. 3C, for example, a portion (upper portion of the transmission line 9) between the junction lands 25 is exposed with UV (Ultra Violet Rays) or the like and is developed by Na$_2$CO$_3$ or the like. By doing so, other unnecessary portions of the insulator layer 11 except the above portion are removed. Accordingly, the transmission line 9 is covered with the insulator layer 11. Like this, the insulator layer 11 can be easily formed on the base material 1 so as to cover the transmission line 9.

Image plane formation step:

In an image plane formation step, the image plane 13 for controlling the characteristic impedance of the transmission line 9 is formed on the insulator layer 11 so as to be opposite to the transmission line 9 and to be grounded. This image plane 13 is formed of a conductive paste and this conductive paste is, for example, a copper paste.

Figure 3D:
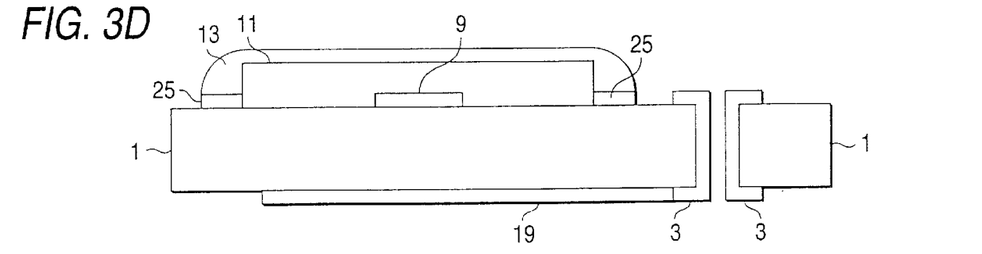
Figure 3E:
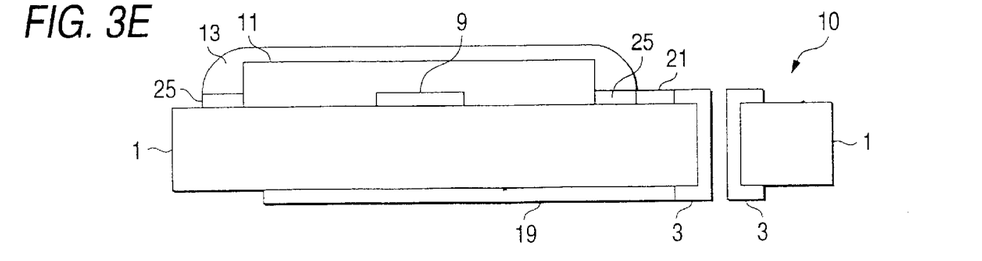

Specifically, in the image plane formation step, as shown in FIG. 3D, the image plane 13 for controlling the characteristic impedance of the transmission line 9 is printed so as to be opposite to the transmission line 9 and is thermally hardened. Besides, in the image plane formation step, as shown in FIG. 3E, the image plane 13 is connected to the via hole 3 through a connection line 21, and the solid layer 19 is connected to the via hole 3, so that the image plane 13 is grounded (or connected to a power supply). Here, the junction land 25 may be directly connected to the via hole 3 without using the connection line 21. Besides, it is needless to say that the image plane 13 may be directly connected to the via hole 3 so that it is connected to the solid layer 19.

According to the first embodiment of the present invention, the transmission line 9 and the image plane 13 are not provided in a plane direction but stacked, so that the image plane 13 can be formed with a small space on the base material 1. Besides, since it is not necessary to use an expensive multilayer substrate, the impedance control board 10 can be manufactured inexpensively and easily. Accordingly, at the time of manufacture of the impedance control board 10, it is not necessary to use a batch type large heat press which is conventionally used for manufacture of a multilayer substrate and takes labor, and continuous production is enabled by an automated inline type manufacturing apparatus, so that the productivity can be improved.

Besides, in the impedance control board 10, since the image plane 13 can control the characteristic impedance of the transmission line 9, EMI (ElectroMagnetic Interference) noise or radiation noise can be cut off, and the high frequency signal can be stably transmitted while the delay of the high frequency signal of the transmission line 9 is prevented.

Second Embodiment

Figure 2:
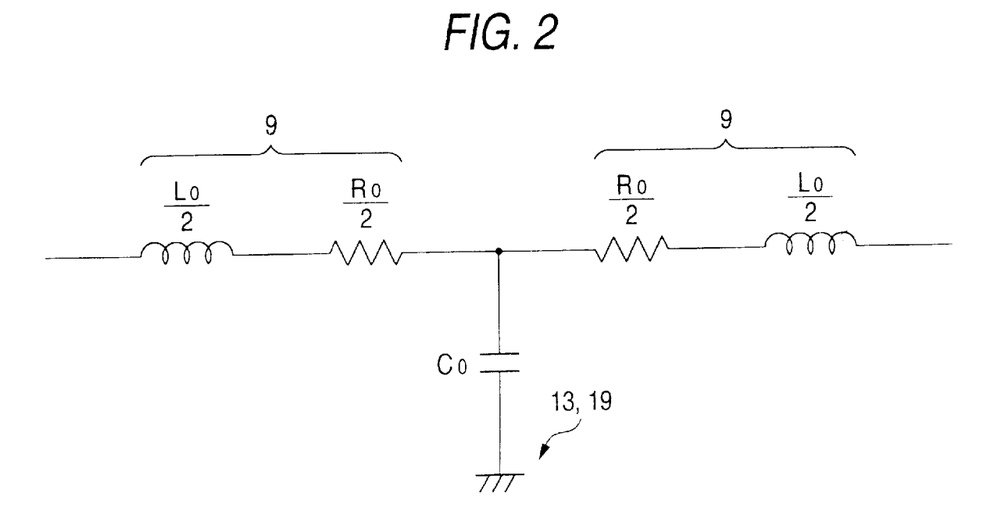
FIG. 2 is a circuit diagram showing an example of an equivalent circuit of the impedance control board of FIG. 1.

Since an impedance control board 10 as a second embodiment is substantially the same as the impedance control board 10 as the first embodiment in FIGS. 1 to 3 in the constitution and manufacturing method, the characters in FIGS. 1 to 3 are used for the same constitution and manufacturing method, and different points will be mainly described.

The second embodiment is different from the first embodiment in a manufacturing method of the impedance control board 10.

Since the manufacturing method of the impedance control board 10 as the second embodiment is substantially the same as the procedure in FIGS. 3A to 3E, the same characters are used for the portion of the same procedure to omit its explanation, and a description will be mainly given of different points below. In the manufacturing method of the impedance control board 10 as the second embodiment, the insulator layer formation step of FIG. 3B is different.

Figure 4A:
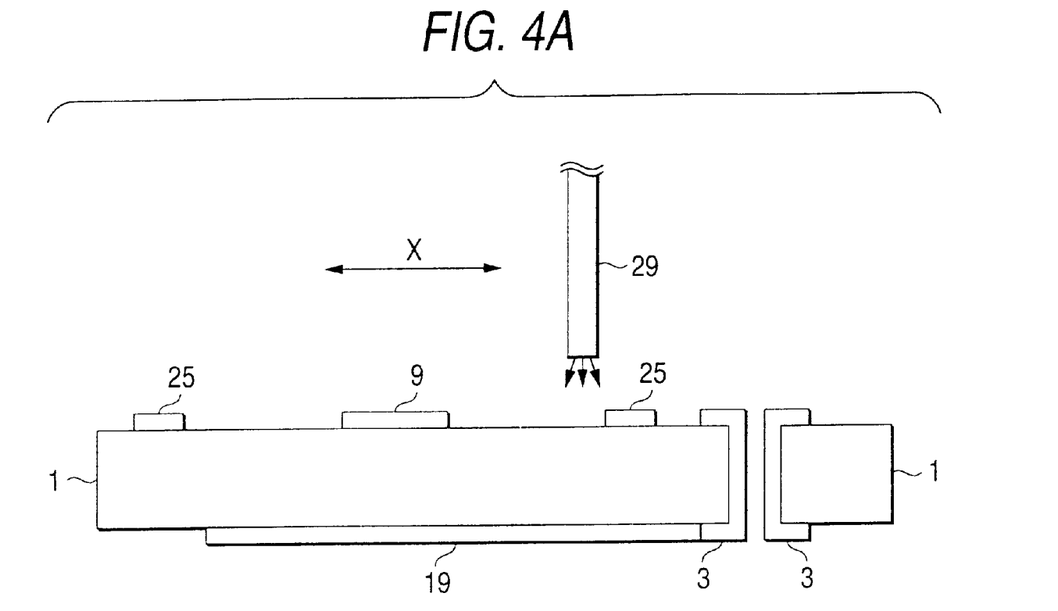
FIGS. 4A and 4B are sectional views showing an example of a part of a manufacturing method of an impedance control board as a second embodiment.
Figure 4B:
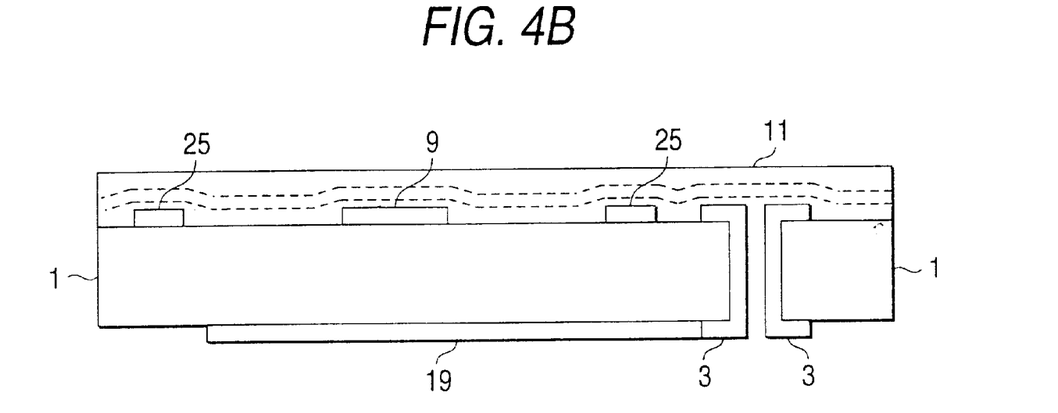

FIGS. 4A to 4B are sectional views respectively showing an example of a part of the manufacturing method of the impedance control board 10 as the second embodiment.

Insulator formation step:

In an insulator formation step, so-called curtain coat coating is used. That is, in the insulator formation step, as shown in FIG. 4A, a resist coating part 29 for coating liquid resist, which becomes an insulator layer 11, coats a base material 1 with the liquid resist, on which a transmission line 9 and the like are formed. The material of this liquid resist is, for example, a liquid epoxy resin having photosensitivity. This base material 1 advances in either direction of an X direction. Incidentally, it is needless to say that this base material 1 may be fixed, and the resist coating part 29 makes a coating while advancing in either direction of the X direction. This liquid resist is repeatedly coated on the base material 1, and a plurality of resist layers are formed, so that the insulator layer 11 as shown in FIG. 4B is formed. Since steps, such as exposure and development, other than this are similar to the first embodiment, the description is omitted.

According to the second embodiment of the present invention, substantially the same effect as the first embodiment can be produced.

Third Embodiment

Since an impedance control board 10 (printed wiring board) as a third embodiment is substantially the same as the impedance control board 10 as the first embodiment in FIGS. 1 to 3 in the constitution and manufacturing method, the characters in FIGS. 1 to 3 are used for the same constitution and manufacturing method, and different points will be mainly described.

The third embodiment is different from the first embodiment in a manufacturing method of the impedance control board 10.

Since the manufacturing method of the impedance control board 10 as the third embodiment is substantially the same as the procedure in FIGS. 3A to 3E, the same characters are used for the portion of the same procedure to omit its explanation, and a description will be mainly given of different points below. In the manufacturing method of the impedance control board 10 as the third embodiment, the insulator layer formation step of FIG. 3B is different.

Figure 5A:
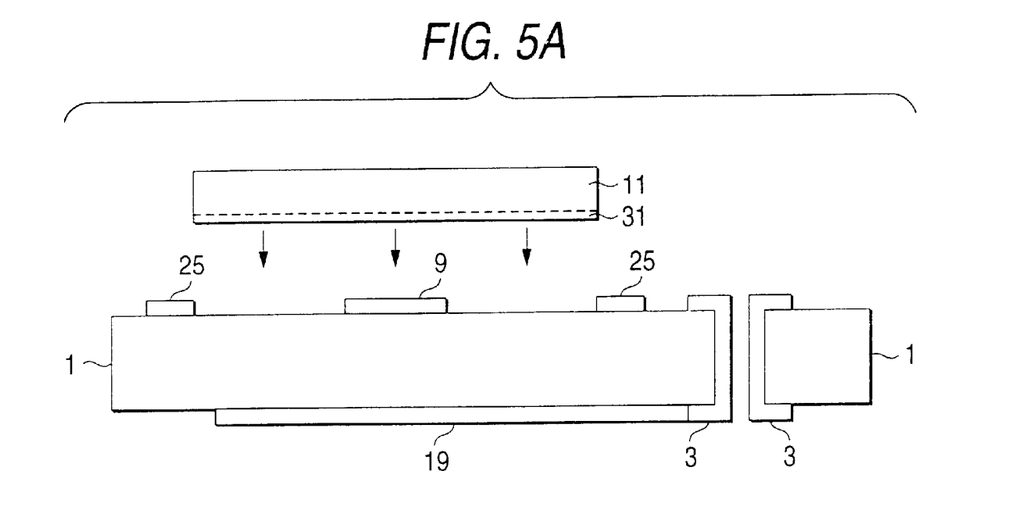
FIGS. 5A and 5B are sectional views showing an example of a part of a manufacturing method of an impedance control board as a third embodiment.
Figure 5B:
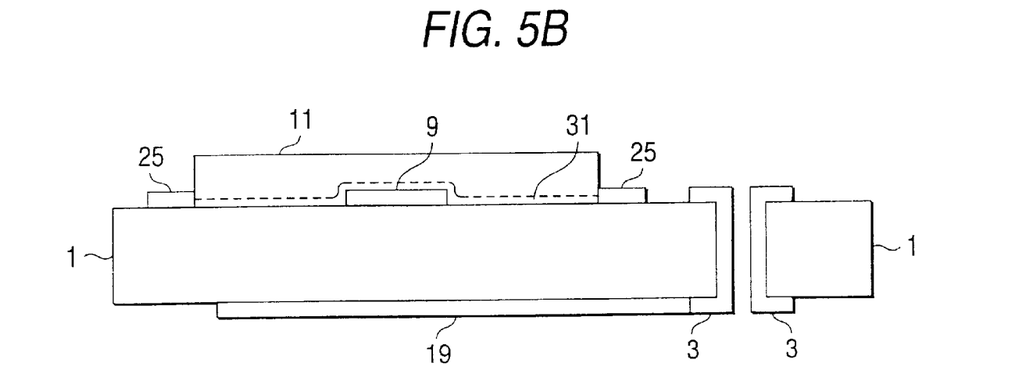

FIGS. 5A to 5B are sectional views respectively showing an example of a part of the manufacturing method of the impedance control board 10 as the third embodiment.

Insulator formation step:

In an insulator formation step, as shown in FIG. 5A, an insulator layer 11 provided with an adhesive layer 31 is fixed to a base material 1 on which a transmission line 9 and the like are formed, through thermocompression bonding or the like. This insulator layer 11 is a film or a tape of a material of, for example, polyimide, epoxy or PET (Poly Ethylene Terephthalate). When the insulator layer 11 provided with the adhesive layer 31 is processed into a desired shape, steps, such as exposure and development, for removing unnecessary portions of the insulator layer 11 become unnecessary. Accordingly, the manufacturing method of the impedance control board 10 is simplified. Thus, as shown in FIG. 5B, the insulator layer 11 is formed on the base material 1 on which the transmission line 9 and the like are formed. Since steps other than this are similar to the first embodiment, the description is omitted.

According to the third embodiment of the present invention, substantially the same effect as the first embodiment can be produced, and in addition to this, unlike the first embodiment and the second embodiment, since a film formed to a thickness is laminated at only a necessary portion, material costs can be restrained from rising.

Fourth Embodiment

Since an impedance control board 10 as a fourth embodiment is substantially the same as the impedance control board 10 as the first embodiment in FIGS. 1 to 3 in the constitution and manufacturing method, the characters in FIGS. 1 to 3 are used for the same constitution and manufacturing method, and different points will be mainly described.

The fourth embodiment is different from the first embodiment in a manufacturing method of the impedance control board 10.

Since the manufacturing method of the impedance control board 10 as the fourth embodiment is substantially the same as the procedure in FIGS. 3A to 3E, the same characters are used for the portion of the same procedure to omit its explanation, and a description will be mainly given of different points below. In the manufacturing method of the impedance control board 10 as the fourth embodiment, the insulator layer formation step of FIG. 3B is different.

Figure 6A:
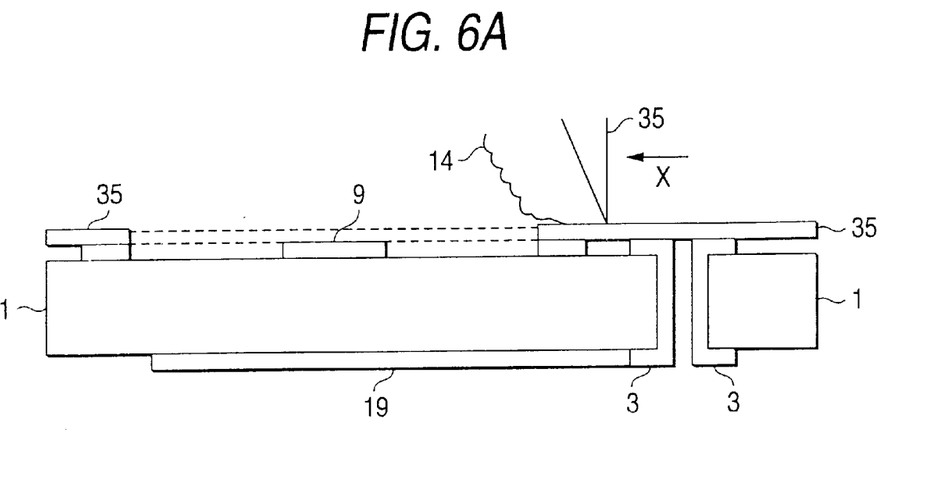
FIGS. 6A and 6B are sectional views showing an example of a part of a manufacturing method of an impedance control board as a fourth embodiment.
Figure 6B:
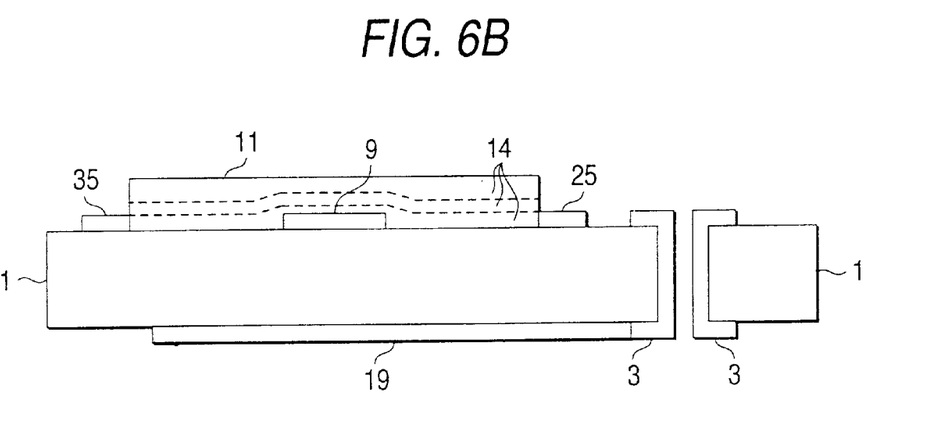

FIGS. 6A to 6B are sectional views respectively showing an example of a part of the manufacturing method of the impedance control board 10 as the fourth embodiment.

Insulator formation step:

In an insulator formation step, as shown in FIG. 6A, a screen 35 is disposed at a predetermined place, and a squeegee 33 is moved in an X direction, so that a photo-curing ink 14 (photo-curing resist) of UV or the like, which becomes an insulator layer 11, is printed. The printed ink 14 is fixed to a base material 1 by irradiation of light such as UV, and is printed. By repeating such a step, as shown in FIG. 6B, the insulator layer 11 formed by multi-printing of the ink 14 is formed on the base material 1. Since steps other than this are similar to the first embodiment, the description is omitted.

Besides, the ink 14 may be of a thermosetting type (thermosetting resist). The printed ink 14 is heated to be fixed to the base material 1 and is printed. Incidentally, it is needless to say that the ink 14 may be hardened by drying.

According to the fourth embodiment of the present invention, substantially the same effect as the first embodiment can be produced, and in addition, in view of material cost and productivity, it becomes most inexpensive among the first embodiment to the third embodiment.

Modified Example

Figure 7:
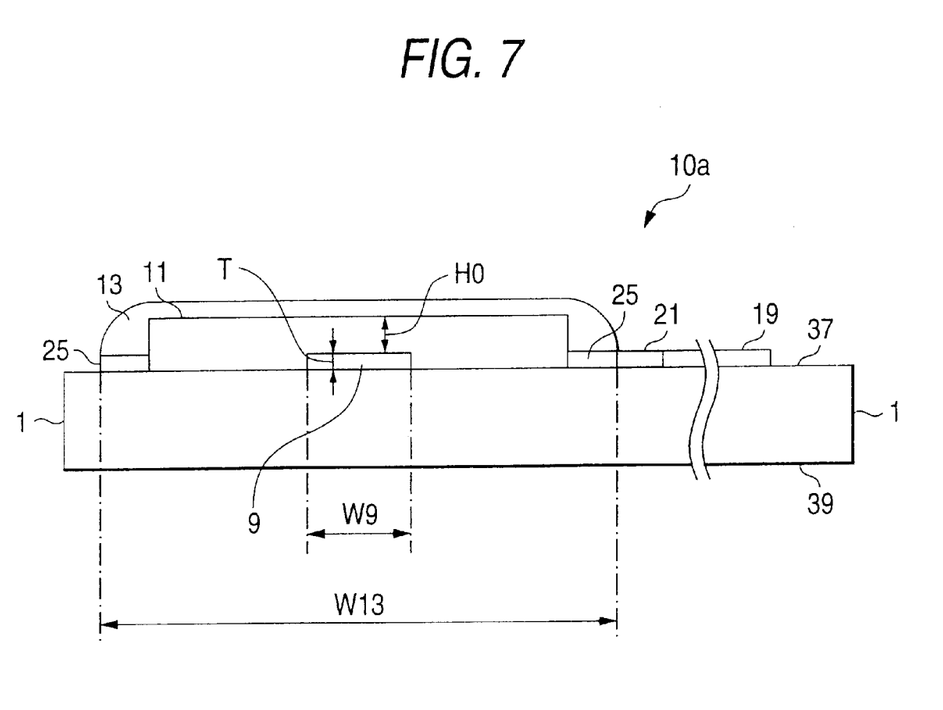
FIG. 7 is a sectional view showing a structural example of an impedance control board as a modified example of the first embodiment to the fourth embodiment.

FIG. 7 is a sectional view showing a structural example of an impedance control board 10a as a modified example of the impedance control board 10 as the first embodiment to the fourth embodiment.

The impedance control board 10a of FIG. 7 is different from the impedance control board 10 in that the via hole 3 provided in the impedance control board 10 does not exist, and a solid layer 19 is provided at the side of one surface 37 on which a transmission line 9 and the like are formed. That is, this solid layer 19 is connected to an image plane 13 at the one surface 37.

Since the other function and constitution of the impedance control board 10a and its manufacturing method are the same as the function and constitution of the impedance control board 10 and its manufacturing method of the first embodiment to the fourth embodiment shown in FIGS. 1 to 6A, 6B, the description is omitted.

According to the modified example of the impedance control board 10a, since the constitution is such that the characteristic impedance of the transmission line 9 can be controlled through only the one surface 37, the structure can be simplified.

Test Example

Next, a test is made as to fluctuation in the value of characteristic impedance Zo of the impedance control board 10 as the first embodiment to the fourth embodiment and the impedance control board 10a.

In a general impedance control board, in the case where a high speed digital signal or a high frequency signal is transmitted through a transmission line, when the value of characteristic impedance fluctuates, signal reflection is caused, and there is a possibility that transmission characteristics are damaged.

Then, in the impedance control board 10 and 10a, it is necessary to raise the precision of the pattern width W9 of the transmission line 9 and the precision of the width H0 of the insulator layer 11. Accordingly, as the manufacturing method of the impedance control board 10 and 10a, the manufacturing method of the fourth embodiment is desirable, however, the manufacturing methods of the first embodiment to the third embodiment are more desirable in that the thickness of the insulator layer 11 can be formed with precision.

Besides, the manufacturing method using the dry film in the first embodiment is especially desirable as the manufacturing method of the impedance control board 10 and 10a. This is because the dry film has features that it can be formed to a desired thickness with high precision before processing, and the thickness after lamination to the base material 1 can be easily controlled.

Besides, it is known that the characteristic impedance is influenced by the relative dielectric constant $\in$ of the insulator layer 11 as indicated by expression (1).

$$Z_o = 87/(\in + 1.41)^{1/2} \cdot \text{Ln}(5.98h/0.80W + T) \tag{1}$$

thickness of insulator layer 11: h thickness of transmission line 9: T relative dielectric constant of insulator layer 11: $\in$ pattern width of transmission line 9: W9

Since a material of a conventional multilayer substrate is glass epoxy, its relative dielectric constant $\in$ is 4.7. On the other hand, the relative dielectric constant $\in$ of the dry film is 3.2, the relative dielectric constant $\in$ of the liquid resist is 3.8, the relative dielectric constant $\in$ of the polyimide is 3.0 to 3.5, and the relative dielectric constant $\in$ of the PET (Poly Ethylene Terephthalate) is 3.2 to 3.3, which are small. Accordingly, these members in the impedance control board 10 and 10a hardly cause the delay of a high frequency signal transmitted through the transmission line 9 at high speed, and are suitable for high speed signal transmission. Besides, since the image plane 13 is disposed so as to cover the transmission line 9, the image plane 13 can produce an electromagnetic interference (EMI: ElectroMagnetic Interference) noise shielding effect of the transmission line 9.

Actually, an example in the case where the characteristic impedance $Z_0 = 50 \pm 10\%$ is made a target is cited. According to the manufacturing method of the first embodiment, it can be realized under the following constitution.

relative dielectric constant of dry film=3.2 thickness of dry film=75±5 $\mu$m thickness of copper foil of double-sided substrate=35 $\mu$m thickness of base material 1=1.6 mm width of transmission line=100±10 $\mu$m Incidentally, the present invention is not limited to the foregoing embodiments.

With respect to the respective components of the above embodiments, a part thereof can be omitted, or they can be arbitrarily combined in a different manner from the above.

As described above, according to the present invention, it is possible to provide a printed wiring board in which control of a characteristic impedance of a signal transmission pattern is realized with a small space and at a low cost, its manufacture is easy, a delay is hard to cause, and a high frequency signal can be stably transmitted.

What is claimed is:

1. A printed wiring board comprising:
    a signal transmission pattern with a predetermined width and thickness provided on a surface of a base material for transmitting a high frequency signal;
    an insulator layer of constant thickness located on a surface of said signal transmission pattern for insulating said signal transmission pattern;
    a connection pattern located on said surface of said base material and not covered by said insulator layer, said connection pattern connected to a reference voltage; and
    an opposing pattern provided on a surface of said insulator layer that is parallel with and opposite to said surface of said signal transmission pattern, said opposing pattern being connected to said connection pattern.

2. The printed wiring board according to claim 1, wherein said opposing pattern is formed of a conductive paste.

3. The printed wiring board according to claim 1, wherein a width of said opposing pattern is at least three times a width of said signal transmission pattern.

4. The printed wiring board according to claim 1, wherein said insulator layer is formed of a dry film of photosensitive epoxy resin.

5. The printed wiring board according to claim 1, wherein said insulator layer is formed by curtain-coat coating of a photosensitive liquid epoxy resin.

6. The printed wiring board according to claim 1, wherein said insulator layer is formed by printing using a photo-curing resist.

7. The printed wiring board according to claim 1, wherein said insulator layer is formed by printing using a thermosetting resist.

8. The printed wiring board according to claim 1, wherein said connection pattern is connected to a solid pattern provided on an other surface of said base material through a hole passing through said base material.

9. A method of manufacturing a printed wiring board, said method comprising the steps of:
    forming a signal transmission pattern for transmitting a high frequency signal and forming a connection pattern for connecting to a reference voltage on a surface of a base material, said signal transmisssion pattern and said connection pattern being coplanar and not connected;
    forming an insulator layer of constant thickness on a surface of said signal transmission pattern for insulating said signal transmission pattern, said insulator layer not covering said connection pattern; and
    forming an opposing pattern on a surface of said insulator layer that is parallel with and opposite to said surface of said signal transmission pattern, said opposing pattern being connected to said connection pattern.

10. The method of manufacturing a printed wiring board according to claim 9, wherein a width of said opposing pattern is at least three times a width of said signal transmission pattern.

11. The method of manufacturing a printed wiring board according to claim 9, wherein said opposing pattern is formed of a conductive paste.

12. The method of manufacturing a printed wiring board according to claim 9, wherein said insulator layer is formed of a dry film of photosensitive epoxy resin.

13. The method of manufacturing a printed wiring board according to claim 9, wherein said insulator layer is formed by curtain-coat coating of a photosensitive liquid epoxy resin.

14. The method of manufacturing a printed wiring board according to claim 9, wherein said insulator layer is formed by printing using a photo-curing resist.

15. The method of manufacturing a printed wiring board according to claim 9, wherein said insulator layer is formed by printing using a thermosetting resist.

16. The method of manufacturing a printed wiring board according to claim 9, wherein said connection pattern is connected to a solid pattern provided on an other surface of said base material through a hole passing through said base material.

* * * * *